United States Patent [19]

Biswas

[11] Patent Number: 4,519,658
[45] Date of Patent: May 28, 1985

[54] ELECTRONIC PACKAGE ASSEMBLY AND ACCESSORY COMPONENT THEREFOR

[75] Inventor: Ranjit Biswas, Plainsboro, N.J.

[73] Assignee: Thomas & Betts Corporation, Raritan, N.J.

[21] Appl. No.: 460,434

[22] Filed: Jan. 24, 1983

[51] Int. Cl.$^3$ ............................................. H01R 23/72
[52] U.S. Cl. .............................. 339/17 CF; 339/17 F; 361/393
[58] Field of Search ............. 339/17 R, 17 C, 17 CF, 339/17 M, 17 LM, 17 E, 17 F, 18 R, 18 P, 143 R, 147 R, 176 MF; 361/393, 396, 400–402, 406; 174/52 FP

[56] References Cited

U.S. PATENT DOCUMENTS

| | | | |
|---|---|---|---|
| 3,277,347 | 10/1966 | Ecker | 339/17 E |
| 3,349,162 | 10/1967 | Eckhardt | 361/401 |
| 3,880,493 | 4/1975 | Lockhart, Jr. | 339/147 |
| 3,912,984 | 10/1975 | Lockhart, Jr. et al. | 339/17 CF |
| 3,999,826 | 12/1976 | Yurtin | 339/17 F |
| 4,012,093 | 3/1977 | Crane | 339/17 |
| 4,116,519 | 9/1978 | Grabbe et al. | 339/17 |
| 4,356,532 | 10/1982 | Donaher et al. | 361/393 |

FOREIGN PATENT DOCUMENTS 464556 8/1975 Australia.
1188520 4/1970 United Kingdom ............. 339/17 F

OTHER PUBLICATIONS

Insulation/Circuits, Dec. 1982, p. 98.

Primary Examiner—Neil Abrams
Attorney, Agent, or Firm—Robert M. Rodrick; Salvatore J. Abbruzzese

[57] ABSTRACT

An accessory circuit component interconnected with the contacts of an electrical package comprises a flexible substrate with a circuit pattern of conductive traces thereon and a decoupling capacitor connected to selected conductive traces. A plurality of deflectable tabs inclusive of a portion of the substrate and a conductive trace are provided interiorly of side margins of the substrate. Upon assembly of the accessory component to a socket, the tabs deflect as urged by the contacts thereby providing openings through the substrate for receipt of the contacts therethrough. The conductive trace portions of the deflected tabs are connected to the contacts bearing thereagainst.

12 Claims, 5 Drawing Figures

ELECTRONIC PACKAGE ASSEMBLY AND ACCESSORY COMPONENT THEREFOR

FIELD OF THE INVENTION

The present invention relates generally to electronic package assemblies and, more particularly, to accessory circuit components for electrical interconnection with electronic packages in such assemblies.

BACKGROUND OF THE INVENTION

Dual-in-line packages (DIP) have found wide use as a means of providing a mounting and interconnection for a variety of integrated circuits. In microelectronic circuits employing a plurality of DIPs, severe noise transients can arise in the power supply circuit due to the very fast switching times of some circuits. One method of preventing the coupling of this undesired high frequency interference into the rest of the circuit is to use low pass filters between the common power supply and the leads attached to the DIPs.

To effect such decoupling, it had been common practice to assemble capacitors on the printed circuit board and then connect such capacitors by conductive traces to the DIP leads corresponding to the power supply connection and ground pins. This procedure has been found to be disadvantageous for at least two reasons. First, it is wasteful of space as the discrete capacitive components are spread out on the printed circuit board and, second, the inductance of the connective conductive traces can nullify the effect of the capacitor in the circuit.

To overcome these disadvantages, the more current art has seen efforts in combining the decoupling capacitor to the DIP or to sockets for joining the DIPs to printed circuit boards. For example, in U.S. Pat. No. 3,880,493 issued to Lockhart, Jr. on April 29, 1975, a decoupling capacitor is encapsulated in the body of a socket for interconnecting a DIP and a printed circuit board. Another example is shown in U.S. Pat. No. 3,912,984 issued to Lockhart, Jr. et al on Oct. 14, 1975 where an auxiliary circuit package containing a decoupling capacitor is designed to occupy the open space between the rows of terminals of a DIP, the contacts of the auxiliary package and the terminals of the DIP being located simultaneously in contact with sockets on a printed circuit board. A further example is disclosed in commonly-owned U.S. Pat. No. 4,356,532 issued to Donaher et al on Oct. 26, 1982 wherein a substrate supporting capacitive components is connected by conductive traces thereon to the contact elements in a DIP receiving receptacle.

While all these current approaches minimize the areas on the printed circuit boards for connection of the decoupling components, they present other disadvantages. In the '493 patent, the encapsulation of the capacitor in the socket prevents ease of maintenance or repair of such component circuit, requiring a costly discarding of the entire socket if replacement is necessary. In the '984 patent, unnecessary terminals of the auxiliary package are provided and means for orienting such terminals relative to the contacts of the DIP is required. In the '532 patent, connection of the planar ear portions of the substrate to surfaces other than flat contact surfaces may provide difficulty in achieving a suitable connection.

Accordingly, it is desirable to provide a technique for interconnecting a decoupling component that not only minimizes real estate on a printed circuit board but is low cost and easy to handle and interconnect.

SUMMARY OF THE INVENTION

It is an object of the present invention to provide an improved accessory circuit component for electrical connection to an electrical package.

A more particular object of the invention is to provide an electrical assembly interconnecting such accessory component to the contacts of an electrical package.

In accordance with the invention, an accessory circuit component comprises a flexible sheet of dielectric material and a conductive trace secured to a surface of such sheet. The component includes a deflectable tab that is defined by at least one cut through both a portion of the flexible sheet and a portion of the conductive trace and by a hinge including an uncut extent of the sheet and conductive trace. Upon deflection of the tab, there is provided an opening for receipt of a contact of the electrical package for connection to the conductive trace portion.

In an electrical assembly, an accessory component means is interconnected to an electrical package having a plurality of spaced electrical contacts extending therefrom, selected ones of such contacts being interconnected to the component means. The component means includes a flexible substrate, a plurality of spaced conductive traces thereon and an electrical component supported by the substrate and electrically connected to selected conductive traces. The component means further includes a plurality of deflectable tabs disposed interiorly of side margins of the substrate, each of the tabs including a portion of the substrate and a portion of a conductive trace. The tabs project outwardly from the substrate and define an opening through which the selected contacts extend, the selected contacts being connected electrically to the conductive trace portions of the tabs.

DETAILED DESCRIPTION OF THE PREFERRED EMBODIMENT

Figure 1:
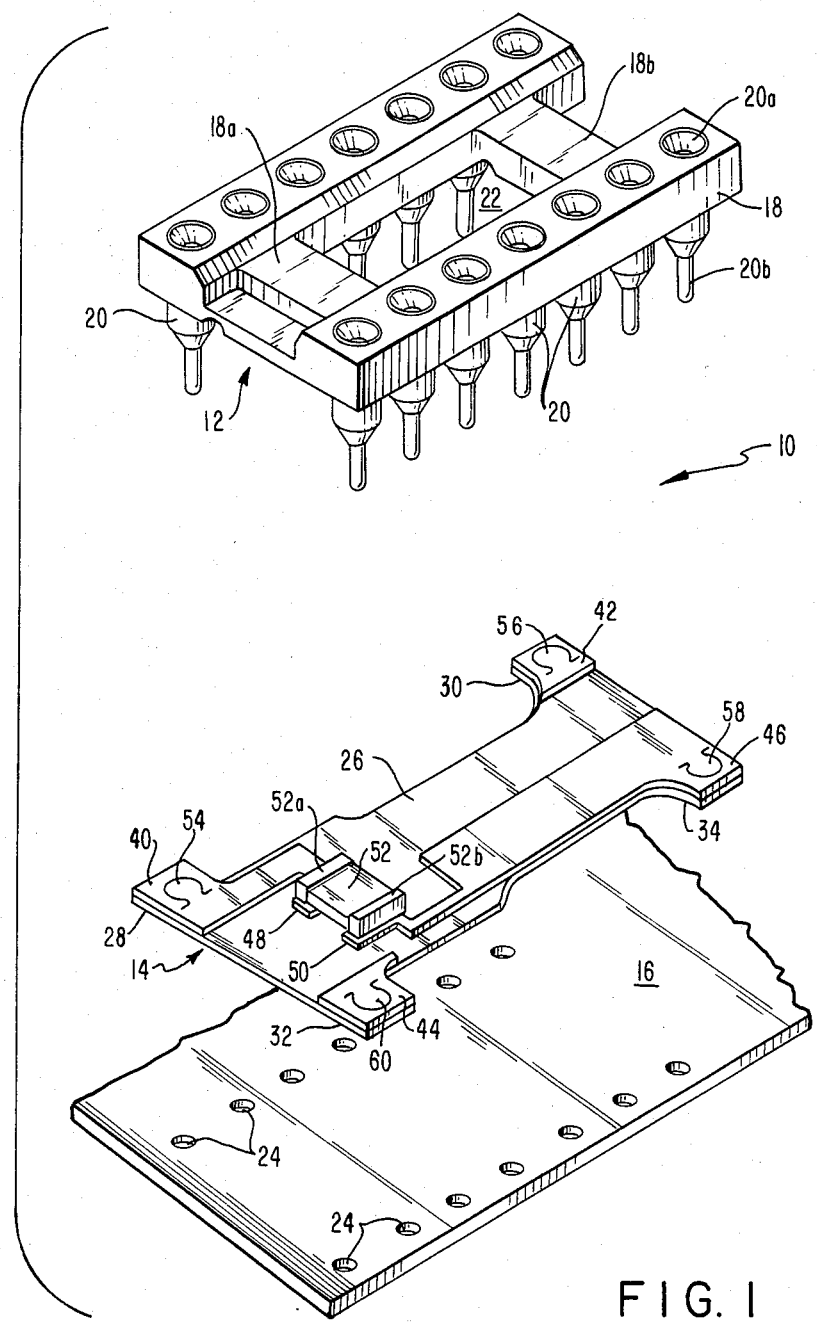
FIG. 1 is an exploded perspective view of the accessory circuit component of the present invention, in assembly with a suitable dual-in-line package socket and a printed circuit board of the types with which the invention may be used.

Referring to FIG. 1, an assembly 10 of an electrical socket 12 for receipt of a dual-in-line package (DIP) and an accessory circuit component 14 are interconnected to a printed circuit board 16. The DIP socket 12 includes a generally elongate body 18 of dielectric material supporting a plurality of substantially identical electrical contacts 20. The contacts 20, each having an upper receptacle 20a and a lower, depending pin 20b, are arranged in two laterally spaced, longitudinally extending rows in the body 18. The socket body 18 includes a pair of longitudinal spaced frame members 18a and 18b defining therebetween an opening 22. Although the socket 12 is depicted as having fourteen contacts 20, it should be appreciated that sockets having desirably more or less contacts are useful in the practice of the invention.

Selected contacts 20 of the socket 12, for example, the four corner contacts, are electrically interconnected to the accessory circuit component 14 in a manner fully described hereinbelow, the contact pins 20b projecting through the circuit component 14 and adapted to enter apertures 24 extending through the printed circuit board 16, such apertures 24 being spaced in corresponding relation to the arrangement of the socket contacts 20. Such interconnection electrically connects the socket contacts 20, the accessory circuit component 14 and suitable circuits or devices (not shown) disposed on the printed circuit board 16.

Figure 2:
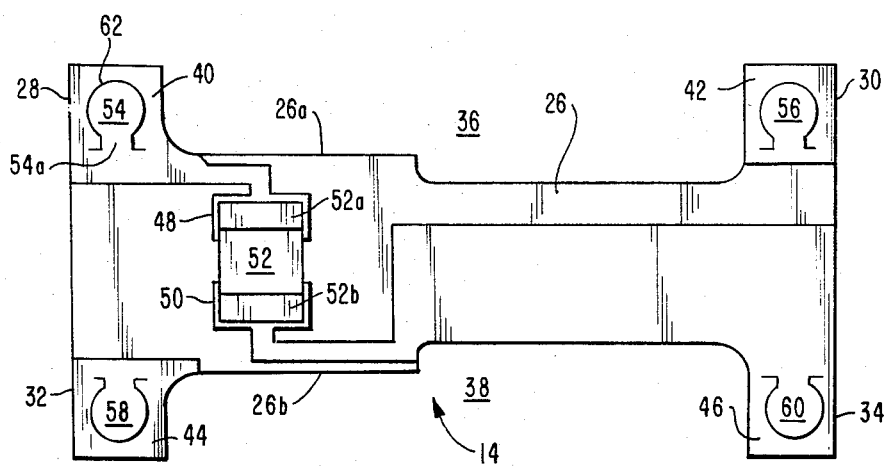
FIG. 2 is a top plan view of the accessory circuit component of FIG. 1.

With reference still to FIG. 1 and also now to FIG. 2, the details of the accessory circuit component may be more completely described. The component 14 includes a thin, flexible substrate 26 of dielectric material. Substrate 26 is preferably formed from a sheet of polyimide on the order of several thousandths of an inch in thickness. In the preferred configuration, the substrate 26 is generally elongate, having laterally spaced side margins 26a and 26b. Spaced longitudinally at each end of the substrate are ear portions 28, 30, 32 and 34, each projecting laterally outwardly of the respective side margins 26a and 26b. Ear portions 28 and 30 define therebetween a cutout portion 36 while ear portions 32 and 34 define therebetween a cutout portion 38, the purposes of such cutout portions being described hereinbelow.

Disposed on the substrate 26 in a manner conventional in the art is a printed circuit of conductive traces. At least one conductive trace is provided in secured registry with each ear portion. Accordingly, conductive traces 40, 42, 44 and 46 are disposed on ear portions 28, 30, 32 and 34, respectively. Trace 40 is connected to a conductive pad 48 and trace 46 is connected to a conductive pad 50, pads 48 and 50 being spaced from each other. A decoupling capacitor 52 is supportively interconnected between traces 40 and 46, one capacitor terminal 52a being connected to pad 48 and another capacitor terminal 52b being connected to pad 50. It should be appreciated that other devices, inclusive of active and passive elements may be used in the accessory circuit component 14.

At each of the ear portions, a deflectable tab is provided, tabs 54, 56, 58 and 60 being in registry with ear portions 28, 30, 32 and 34, respectively. Each of the tabs (described only with reference to tab 54 for the sake of brevity as all the tabs are substantially identical) is defined by a slot or cut 62 that extends through both the conductive trace 40 and the ear portion 28. The cut 62, provided by stamping or other suitable techniques, defines a curved path that is generally D-shaped and traverses nearly a complete loop, an extent 54a of both the trace 40 and the ear portion 28 being left uncut. The uncut extent 54a provides a hinge adjacent the cut 62 about which the tab 54 can bend or deflect. In the preferred arrangement, the tabs are all located within the interior side margins of the ear portions and substrate. It should be understood that the tabs may have different configurations, such as, for example, a tab defined by two substantially parallel cuts, each extending through a peripheral edge of the substrate or the tab may be defined by a generally H-shaped cut fully interiorly of the side margins of the substrate providing effectively two facing deflectable tab portions.

Figure 3:
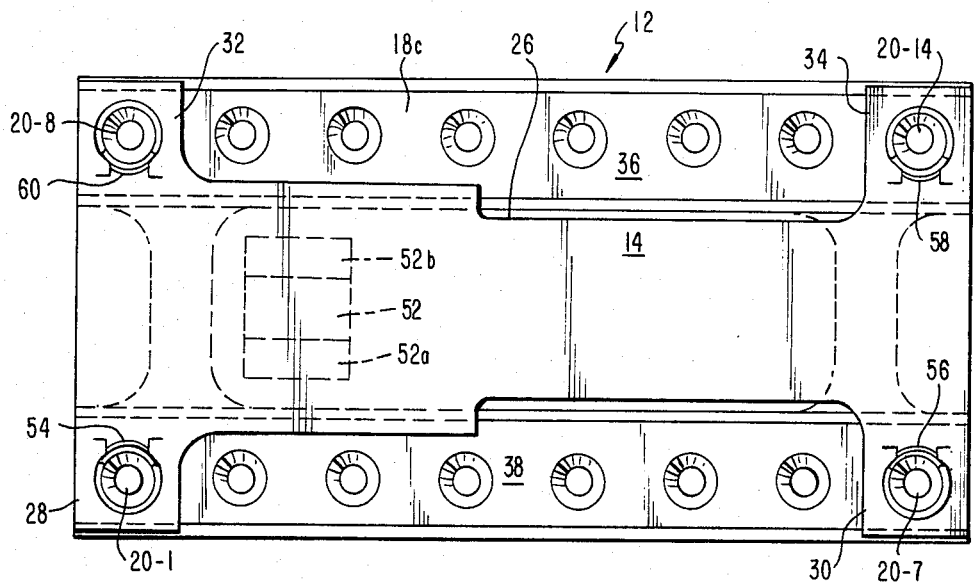
FIG. 3 is a bottom plan view of the assembly of the accessory circuit component and the electrical socket of FIG. 1.
Figure 4:
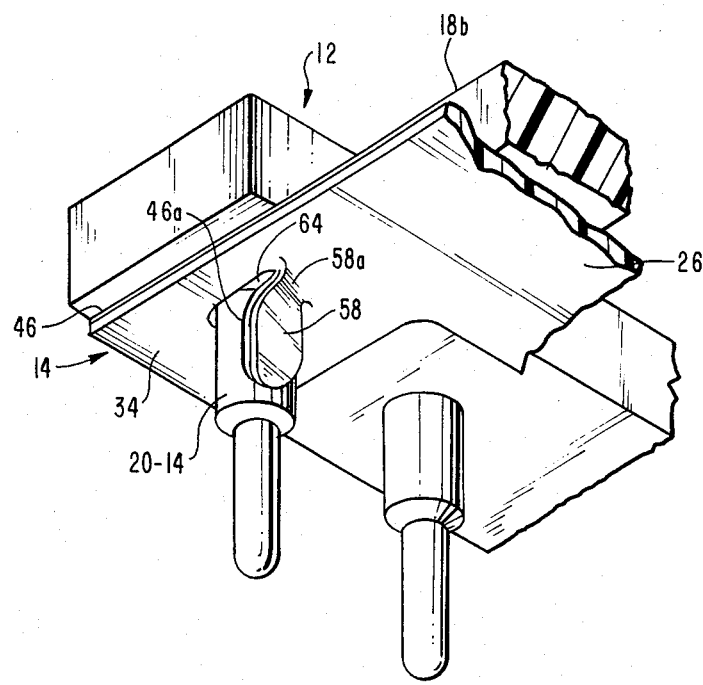
FIG. 4 is a bottom fragmentary perspective view of the assembly of the accessory circuit component and the electrical socket looking at the lower right hand corner of FIG. 1 from the bottom of the assembly.

With reference now to FIGS. 3 and 4, the assembly of the accessory circuit component 14 and the socket 12 is described. During assembly, the four corner pins of the socket contacts 20 are aligned with the tabs 54, 56, 58 and 60 on the substrate, the contact pins being urged against the tabs to cause such tabs to deflect in tongue-like manner, thereby providing an opening, for example, opening 64 in ear portion 34 as shown in FIG. 4, through which the contacts extend. The tab 58, for example, bends downwardly about its hinge 58a, as contact 20-14 is inserted through the opening 64, a portion 46c of the conductive trace bearing against the outer surface of the contact 20-14. In the assembled condition, the tabs project downwardly from the substrate in substantially orthogonal relation thereto. The opening 64, as defined by the cut through the conductive trace 46 and ear portion 34, fully circumscribes the contact 20-14 and as the opening is configured to have relatively close clearance about the contact 20-14, desirably good location and orientation of the substrate 26 relative to the contacts are achieved. The conductive trace portion 46a of the tab 58 is connected to the contact by soldering, but other suitable joining means such as welding, may also be used.

In FIG. 3, the assembly of the socket 12 and the accessory circuit component 14 is seen from the bottom. The substrate 26 is secured preferably against the undersurface 18c of the socket body in substantially parallel relation thereto. The capacitor 52 resides in the opening 22 (FIG. 1) between the body frame members 18a and 18b so as to minimize the profile of the assembly. The capacitor terminal 52a is connected through to contact 20-1, which may be designated as a power pin, while capacitor terminal 52b is connected through trace 46 to contach 20-14, which may be designated as a ground pin. Contacts 20-7 and 20-8 which are attached to tabs 56 and 60, respectively, are not electrically connected in the preferred arrangement to the capacitor, these connections providing mechanical support for the substrate 26. It can also be seen that, in assembly, the side cutout substrate portions 36 and 38 provide clearance about the non-connected contacts 20.

Figure 5:
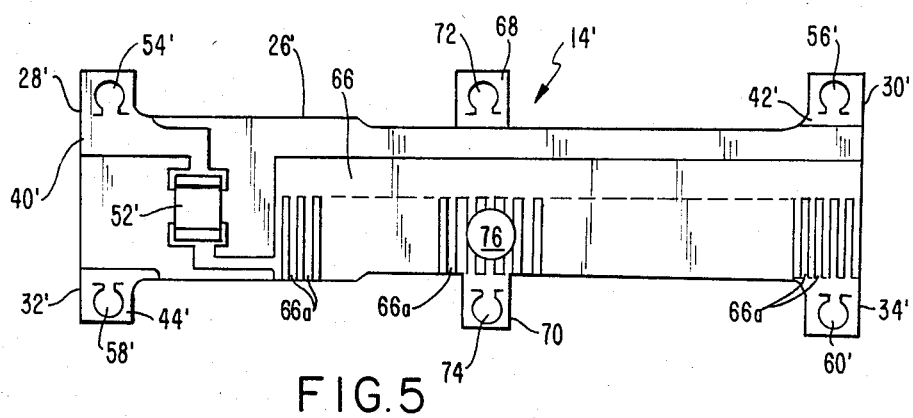
FIG. 5 is a top plan view of a particular form of the accessory circuit component in accordance with a preferred arrangement.

Having described the preferred form of the invention, it can be appreciated that advantages over the known component decoupling techniques are achieved in ease of handling, location and orientation of the assembly parts, as well as in space-saving and height. The construction of the accessory circuit component also lends itself to ease of fabrication to sockets of different contact arrangements, for example, of 16, 18 or 20 contacts. In assemblies of larger socket sizes and more contacts, as the accessory circuit component is flexible, if the corner contacts are connected to the substrate, there may be a tendency for the substrate to sag in the center. Accordingly, intermediate connections would desirably be made. FIG. 5, a modified form of the accessory circuit component is illustrated, which may be used in interconnections with larger sockets while also providing a degree of selectability for contact connections. Accessory circuit component 14' is formed similar to component 14 having a substrate 26' with ear portions 28', 30', 32' and 34' with tabs 54', 56', 58' and 60' in registry therewith. A capacitor 52' is suitably connected to conductive trace 40' and to a conductive trace 66. In this modified version, two further ear portions 68 and 70 are provided with suitable deflectable tabs 72 and 74, ear portion 68 being disposed between ear portions 28' and 30' and ear portion 70 being disposed between ear portions 32' and 34'. Conductive trace 66 includes a plurality of spaced trace elements 66a extending in grid-like manner longitudinally along the substrate 26' such that, through elements 66a, the trace 66 is in registry and electrical connection with both tabs 60' and 74. In addition to providing mechanical support of the substrate 26' in assembly with a socket, selective electrical connection of socket contacts is provided. For example, as shown in FIG. 5, an open electrical path between tab 74 and trace 66 is provided by severing the trace elements 66a adjacent the ear portion 70 by punching an aperture 76 through the elements 66a and underlying substrate 26' so as to electrically isolate the trace 66 and the tab 74. An electrical path between tab 60' and conductive trace 66 is provided by the elements 66a thereat which remain whole and unsevered. Of course, the selection may be reversed wherein tab 74 is electrically connected with trace 66 while tab 60' is isolated electrically therefrom.

Various other modifications to the foregoing particularly described invention will now be evident to those skilled in the art. For example, while the accessory circuit component is interconnected with an electrical socket, it can be appreciated that such accessory component may also be directly attached to the leads of an electrical or electronic package, such as a DIP. Accordingly, the preferred embodiment as described herein is intended in an illustrative rather than a limiting sense. The true scope of the invention is set forth in the following claims.

I claim:

1. An accessory circuit component for electrical connection to selected contacts of a plurality of contacts in an electrical package comprising:
    a flexible sheet of dielectric material;
    a plurality of spaced conductive traces secured to a surface of said flexible sheet; and
    a plurality of deflectable tabs each being in registry with selected ones of said conductive traces and defined by at least one cut through both a portion of said flexible sheet and a portion of a conductive trace and a hinge including an uncut extent of said flexible sheet portion and a conductive trace portion adjacent said cut, there being provided upon deflection of each tab an opening for receipt of a selected contact of said electrical package for connection of such contact to said conductive trace portion,
    said flexible sheet being elongate, ear portions extending laterally from a side margin at longitudinally spaced locations defining therebetween a cutout of said flexible sheet for residence therebetween of contacts of said package to which connection is not to be made, a conductive trace being disposed on each said ear portion and a deflectable tab being in registry with each such ear portion.

2. A component according to claim 1, wherein said cut extends continuously from one side of said hinge along a curved path to the other side of said hinge.

3. A component according to claim 2, wherein said cut defines a generally D-shaped opening about said tab.

4. A component according to claim 1, wherein said flexible sheet comprises at least two ear portions with tabs in registry therewith extending from each lateral side of said flexible sheet.

5. A component according to claim 1, wherein one of said conductive traces is in electrical contact with plural of said tabs and further including means for selective connection between such one conductive trace and said tabs.

6. A component according to claim 5, wherein said selective connection means comprises a plurality of spaced conductive trace elements connected between said one conductive trace and said tabs and means for isolating one or more tabs from said one conductive trace.

7. A component according to claim 6, wherein said isolating means comprises an opening severing one or more of said space conductive trace elements thereby providing an open path between such one or more tabs and said one conductive trace.

8. A component according to claim 1, wherein said cut is disposed interiorly of side margins of said flexible sheet, said tab being thereby fully bounded by said flexible sheet.

9. An electrical assembly comprising:
    an electrical package having a plurality of spaced electrical contacts projecting therefrom, said electrical package comprising a generally elongate body, said electrical contacts projecting from said body being in mutually spaced pairs extending longitudinally along said body; and
    accessory component means in connection with selected contacts of said electrical package, said component means including an elongate, flexible substrate, a plurality of spaced conductive traces secured thereto and an electrical component supported by said substrate and electrically connected to selected conductive traces, said substrate being electrically connected to selected ones of said contacts and supported thereby adjacent said body, said component means further including a plurality of deflectable tabs disposed interiorly of side margins of said substrate, each of said tabs including a portion of said flexible substrate and a portion of a conductive trace, said tabs projecting outwardly from said substrate and defining an opening through which said selected contacts extend, said selected contacts being electrically connected to said conductive trace portions of said tabs, said substrate including at least two ear portions extending laterally outwardly from the same side margin of said substrate and being longitudinally spaced therealong with the tabs thereat being in connection with non-adjacent package contacts, said conductive traces and tabs being in registry with such ear portions, said substrate having a longitudinal cutout portion between said ear portions thereby providing clearance about package contacts disposed between said connected package contacts.

10. An assembly according to claim 9, wherein said openings defined by said tabs fully circumscribe the contacts of said electrical package received therein.

11. An assembly according to claim 9, wherein said body and said substrate are supported in generally parallel relation and wherein said tabs in connection with said selected contacts project substantially orthogonal to said substrate.

12. An assembly according to claim 9, wherein at least three of said laterally extending ear portions are longitudinally spaced along the same margin with the tabs in registry with at least two of such three ear portions each being connected to a plurality of grid-like conductive trace elements, said grid-like conductive trace elements being connected to one of said conductive traces, the trace elements between one of such tabs and said one conductive trace being severed thereby providing an open circuit path therebetween, the trace elements between the other of such tabs and such one conductive trace being whole and thereby providing a conductive path therebetween.

* * * * *